United States Patent
Cheng et al.

(10) Patent No.: US 10,236,573 B2
(45) Date of Patent: Mar. 19, 2019

(54) ON-CHIP COUPLING CAPACITOR WITH PATTERNED RADIO FREQUENCY SHIELDING STRUCTURE FOR LOWER LOSS

(71) Applicant: QUALCOMM Incorporated, San Diego, CA (US)

(72) Inventors: Haitao Cheng, San Diego, CA (US); Zhang Jin, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/687,065

(22) Filed: Aug. 25, 2017

(65) Prior Publication Data
US 2018/0366822 A1 Dec. 20, 2018

Related U.S. Application Data

(60) Provisional application No. 62/522,440, filed on Jun. 20, 2017.

(51) Int. Cl.
*H01Q 1/52* (2006.01)
*H01Q 1/48* (2006.01)
*H01Q 1/22* (2006.01)

(52) U.S. Cl.
CPC ........... *H01Q 1/526* (2013.01); *H01Q 1/2283* (2013.01); *H01Q 1/48* (2013.01)

(58) Field of Classification Search
CPC ......... H01Q 1/526; H01Q 1/2283; H01Q 1/48
(Continued)

(56) References Cited

U.S. PATENT DOCUMENTS 7,439,570 B2    10/2008  Anthony
7,939,864 B1 *   5/2011  Blednov ............... H01L 23/645
                                                      257/275
(Continued)

FOREIGN PATENT DOCUMENTS

JP    2003297964 A    10/2003
JP    2007306290 A    11/2007
WO    WO-2004112185 A1  12/2004

OTHER PUBLICATIONS

International Search Report and Written Opinion—PCT/US2018/037402—ISA/EPO—dated Sep. 21, 2018.

*Primary Examiner* — Peguy Jean Pierre
(74) *Attorney, Agent, or Firm* — Qualcomm Incorporated/Seyfarth Shaw LLP

(57) ABSTRACT

A capacitor radio frequency (RF) shielding structure may include a ground plane partially surrounding a coupling capacitor in an RF signal path. The ground plane may include a first ground plane portion extending between a positive terminal of the RF signal path and a negative terminal of the RF signal path. The ground plane may include a second ground plane portion extending between the positive terminal and the negative terminal of the RF signal path. The second ground plane portion may be opposed the first ground plane portion. The capacitor RF shielding structure may also include a patterned shielding layer electrically contacting the first ground plane portion and/or the second ground plane portion. The patterned shielding layer may electrically disconnecting a return current path over the patterned shielding layer to confine a return current to flowing over the first ground plane portion or the second ground plane portion.

20 Claims, 15 Drawing Sheets

(58) Field of Classification Search
USPC .......................................................... 343/841
See application file for complete search history.

(56) References Cited

U.S. PATENT DOCUMENTS

| | | | |
|---|---|---|---|
| 8,279,025 | B2 | 10/2012 | Cho |
| 8,659,126 | B2 | 2/2014 | Lin et al. |
| 8,759,893 | B2 | 6/2014 | Cho |
| 9,224,685 | B1 | 12/2015 | Ding et al. |
| 9,532,491 | B2* | 12/2016 | Hashido ............... G02F 1/13306 |
| 2003/0160324 | A1* | 8/2003 | Dragon ................. H01L 29/402 |
| | | | 257/758 |
| 2006/0237819 | A1 | 10/2006 | Kikuta et al. |
| 2007/0284724 | A1* | 12/2007 | Englekirk ............... H01L 23/66 |
| | | | 257/692 |
| 2013/0093045 | A1 | 4/2013 | Cho |
| 2014/0133115 | A1* | 5/2014 | Iguchi ................... H05K 1/0243 |
| | | | 361/760 |
| 2016/0028140 | A1 | 1/2016 | Kato et al. |
| 2016/0309576 | A1* | 10/2016 | Sharav ................. H05K 1/0213 |

\* cited by examiner

Fishbone

ON-CHIP COUPLING CAPACITOR WITH PATTERNED RADIO FREQUENCY SHIELDING STRUCTURE FOR LOWER LOSS

CROSS-REFERENCE TO RELATED APPLICATION

This application claims the benefit of U.S. Provisional Patent Application No. 62/522,440, filed on Jun. 20, 2017, entitled "ON-CHIP CAPACITOR WITH PATTERNED RADIO FREQUENCY SHIELDING STRUCTURE FOR LOWER LOSS," the disclosure of which is expressly incorporated by reference herein in its entirety.

BACKGROUND

Technical Field

Aspects of the present disclosure relate to semiconductor devices, and more particularly to an on-chip coupling capacitor with a patterned radio frequency (RF) shielding structure.

Background

Mobile radio frequency (RF) chip designs (e.g., mobile RF transceivers) have migrated to a deep sub-micron process node due to cost and power consumption considerations. The design complexity of mobile RF transceivers is further complicated by added circuit functions to support communication enhancements, such as carrier aggregation. Further design challenges for mobile RF transceivers include the use of passive devices, which directly affect analog/RF performance considerations, including mismatch, noise, and other performance considerations.

Passive devices may involve high performance capacitor components. For example, analog integrated circuits use various types of passive devices, such as integrated capacitors. These integrated capacitors may include metal-oxide-semiconductor (MOS) capacitors, p-n junction capacitors, metal-insulator-metal (MIM), poly-to-poly capacitors, metal-oxide-metal (MOM) capacitors, and other like capacitor structures. MOM capacitors are also known as vertical parallel plate (VPP) capacitors, natural vertical capacitors (NVCAP), lateral flux capacitors, comb capacitors, as well as interdigitated finger capacitors. MOM capacitors exhibit beneficial characteristics including high capacitance density, low parasitic capacitance, superior RF characteristics, and good matching characteristics without additional masks or process steps relative to other capacitor structures.

MOM capacitors are one of the most widely used capacitors due to their beneficial characteristics. In particular, MOM capacitors may be used as high quality capacitors in semiconductor processes without incurring the cost of an extra processing step relative to other capacitor structures. MOM capacitor structures realize capacitance by using fringe capacitance produced by sets of interdigitated fingers. That is, MOM capacitors may harness lateral capacitive coupling between plates formed by metallization layers and wiring traces.

The design of mobile RF transceivers may include the use of MOM capacitors in an RF signal path. MOM capacitors used in the RF signal path may suffer from poor signal isolation and/or substrate signal loss. In practice, a shielding structure may protect MOM capacitors in the RF signal path. Unfortunately, current flow on the shielding structure may further increase RF signal loss.

SUMMARY

A capacitor radio frequency (RF) shielding structure may include a ground plane partially surrounding a coupling capacitor in an RF signal path. The ground plane may include a first ground plane portion extending between a positive terminal of the RF signal path and a negative terminal of the RF signal path. The ground plane may include a second ground plane portion extending between the positive terminal and the negative terminal of the RF signal path. The second ground plane portion may oppose the first ground plane portion. The capacitor RF shielding structure may also include a patterned shielding layer electrically contacting the first ground plane portion and/or the second ground plane portion. The patterned shielding layer may electrically disconnect a return current path over the patterned shielding layer to confine a return current to flowing over the first ground plane portion or the second ground plane portion.

A method for fabricating a capacitor radio frequency (RF) shielding structure may include fabricating a first ground plane portion and a second ground plane portion of a ground plane partially surrounding a coupling capacitor in an RF signal path between a positive terminal and a negative terminal of the RF signal path. The second ground plane portion may oppose the first ground plane portion. The method may also include depositing and patterning a shielding material to form a patterned shielding layer electrically contacting the first ground plane portion and/or the second ground plane portion. The patterned shielding layer may electrically disconnect a return current path over the patterned shielding layer to confine a return current to flowing over the first ground plane portion or the second ground plane portion.

A capacitor radio frequency (RF) shielding structure may include a ground plane partially surrounding a coupling capacitor in an RF signal path. The ground plane may include a first ground plane portion extending between a positive terminal of the RF signal path and a negative terminal of the RF signal path. The ground plane may include a second ground plane portion extending between the positive terminal and the negative terminal of the RF signal path. The second ground plane portion may oppose the first ground plane portion. The capacitor RF shielding structure may also include means for electrically disconnecting a return current path and redirecting a return current to flowing over the first ground plane portion and/or the second ground plane portion.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
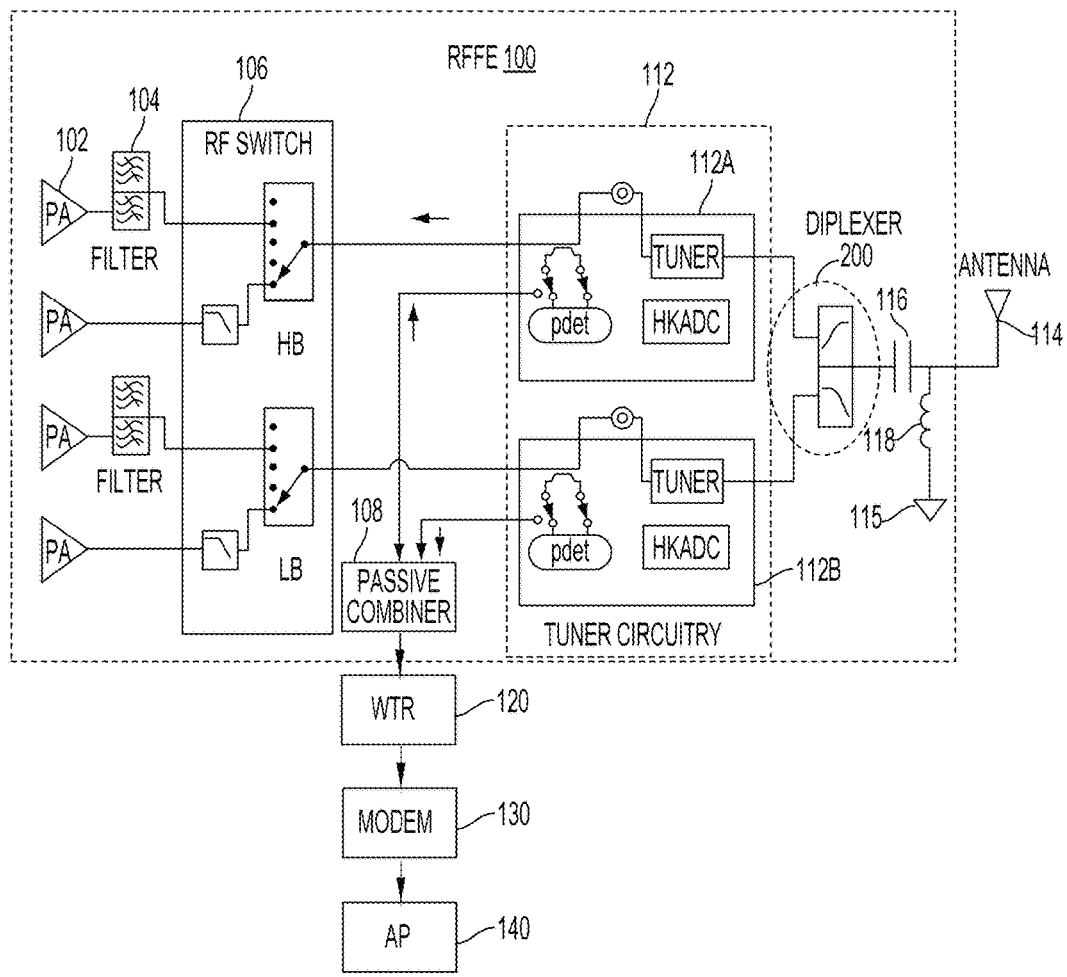
FIG. 1 is a schematic diagram of a radio frequency (RF) front end (RFFE) module employing passive devices.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts.

As described herein, the use of the term "and/or" is intended to represent an "inclusive OR", and the use of the term "or" is intended to represent an "exclusive OR". As described herein, the term "exemplary" used throughout this description means "serving as an example, instance, or illustration," and should not necessarily be construed as preferred or advantageous over other exemplary configurations. As described herein, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

Mobile radio frequency (RF) chip designs (e.g., mobile RF transceivers) have migrated to a deep sub-micron process node due to cost and power consumption considerations. The design complexity of mobile RF transceivers is further complicated by added circuit functions to support communication enhancements, such as carrier aggregation. Further design challenges for mobile RF transceivers include the use of passive devices, which directly affect analog/RF performance considerations, including mismatch, noise, and other performance considerations.

Passive devices in mobile RF transceivers may include high performance capacitor components. For example, analog integrated circuits use various types of passive devices, such as integrated capacitors. These integrated capacitors may include metal-oxide-semiconductor (MOS) capacitors, p-n junction capacitors, metal-insulator-metal (MIM), poly-to-poly capacitors, metal-oxide-metal (MOM) capacitors, and other like capacitor structures. Capacitors are generally passive elements used in integrated circuits for storing electric charge. For example, parallel plate capacitors are often made using plates or structures that are conductive with an insulating material between the plates. The amount of storage, or capacitance, for a given capacitor is contingent upon the materials used to make the plates and the insulator, the area of the plates, and the spacing between the plates. The insulating material is often a dielectric material.

These parallel plate capacitors, however, may consume a large area on a semiconductor chip because many designs place the capacitors over the substrate of the chip. Unfortunately, this approach takes up a large amount of substrate area, which reduces the available area for active devices.

Another approach is to create a vertical structure, which may be known as a vertical parallel plate (VPP) capacitor. A VPP capacitor structure may be created through stacking of the interconnect layers on a chip. VPP capacitor structures, however, have lower capacitive storage, or lower "density," in that these structures do not store much electric charge. In particular, the interconnect and via layer interconnect traces used to fabricate VPP capacitors may be very small in size. The spacing between the interconnects and via layer conductive traces in VPP structures is limited by design rules. Consequently, fabrication of VPP structures may result in a large area consumption for achieving certain desired capacitance for such structures. Although described as "vertical," these structures can be in any direction that is substantially perpendicular to the surface of the substrate, or at other angles that are not substantially parallel to the substrate.

A MOM capacitor is one example of a VPP capacitor. The design of mobile RF transceivers may include MOM capacitors in an RF signal path as a coupling capacitor. Coupling capacitors in the RF signal path may suffer from poor signal isolation and/or increased substrate signal loss. In practice, a shielding structure may protect the coupling capacitors in the RF signal path. Unfortunately, current flow on the shielding structure may further increase signal loss.

For example, a metal or polysilicon shielding structure may be placed under the coupling capacitors in the RF signal path for signal isolation and/or for lowering substrate loss.

Unfortunately, a return current from the RF signal path tends to flow close to a signal current of the RF signal path. The return current introduces more loss because shielding materials of metal/polysilicon exhibit poor conductivity. Consequently, conventional shielding structures for coupling capacitors may be insufficient for preventing RF signal path loss in integrated circuit (IC) analog devices for future process technologies.

Various aspects of the disclosure provide a patterned shielding structure for coupling capacitors in an RF signal path. The process flow for fabrication of coupling capacitors may include front-end-of-line (FEOL) processes, middle-of-line (MOL) processes, and back-end-of-line (BEOL) processes. It will be understood that the term "layer" includes film and is not to be construed as indicating a vertical or horizontal thickness unless otherwise stated. As described, the term "substrate" may refer to a substrate of a diced wafer or may refer to a substrate of a wafer that is not diced. Similarly, the terms chip and die may be used interchangeably.

As described, the back-end-of-line interconnect layers may refer to the conductive interconnect layers (e.g., a first interconnect layer (M1) or metal one M1, metal two (M2), metal three (M3), metal four (M4), etc.) for electrically coupling to front-end-of-line active devices of an integrated circuit. The back-end-of-line interconnect layers may electrically couple to middle-of-line interconnect layers, for example, connecting M1 to an oxide diffusion (OD) layer of an integrated circuit. The middle-of-line interconnect layer may include a zero interconnect layer (M0) for connecting M1 to an active device layer of an integrated circuit. A back-end-of-line first via (V2) may connect M2 to M3 or others of the back-end-of-line interconnect layers.

Aspects of the present disclosure describe a capacitor RF shielding structure for coupling capacitors in an RF signal path. The capacitor RF shielding structure may include a ground plane at least partially surrounding a coupling capacitor. The ground plane may include a first ground plane portion extending between a positive terminal of the RF signal path and a negative terminal of the RF signal path. The ground plane also includes a second ground plane portion extending between the positive terminal and the negative terminal of the RF signal path. The second ground plane portion may be opposite the first ground plane portion. The capacitor RF shielding structure may include a patterned shielding structure that electrically contacts the first ground plane portion and/or the second ground plane portion. In this configuration, the patterned shielding structure electrically disconnects a return current path over the patterned shielding structure to confine a return current to flowing over the first ground plane portion and the second ground plane portion.

According to aspects of the present disclosure, the patterned shielding structure confines the return current to flowing over the first ground plane portion and the second ground plane portion. That is, the electrical disconnection prohibits the return current from propagating over the patterned shielding structure. Preventing (or reducing) the return current from propagating over the patterned shielding structure improves signal isolation and lowers substrate loss because the ground plane has better conductivity relative to the patterned shielding layer materials. The patterned shielding layer may limit and/or prevent the return current flow on shielding materials (e.g., metal or polysilicon) of the patterned shielding structure for reducing coupling capacitor loss in the RF signal path.

FIG. 1 is a schematic diagram of a radio frequency (RF) front end (RFFE) module 100 employing passive devices including a capacitor 116. The RF front end module 100 includes power amplifiers 102, duplexer/filters 104, and a radio frequency (RF) switch module 106. The power amplifiers 102 amplify signal(s) to a certain power level for transmission. The duplexer/filters 104 filter the input/output signals according to a variety of different parameters, including frequency, insertion loss, rejection or other like parameters. In addition, the RF switch module 106 may select certain portions of the input signals to pass on to the rest of the RF front end module 100.

The radio frequency (RF) front end module 100 also includes tuner circuitry 112 (e.g., first tuner circuitry 112A and second tuner circuitry 112B), the diplexer 200, a capacitor 116, an inductor 118, a ground terminal 115, and an antenna 114. The tuner circuitry 112 (e.g., the first tuner circuitry 112A and the second tuner circuitry 112B) includes components such as a tuner, a portable data entry terminal (PDET), and a house keeping analog to digital converter (HKADC). The tuner circuitry 112 may perform impedance tuning (e.g., a voltage standing wave ratio (VSWR) optimization) for the antenna 114. The RF front end module 100 also includes a passive combiner 108 coupled to a wireless transceiver (WTR) 120. The passive combiner 108 combines the detected power from the first tuner circuitry 112A and the second tuner circuitry 112B. The wireless transceiver 120 processes the information from the passive combiner 108 and provides this information to a modem 130 (e.g., a mobile station modem (MSM)). The modem 130 provides a digital signal to an application processor (AP) 140.

As shown in FIG. 1, the diplexer 200 is between the tuner component of the tuner circuitry 112 and the capacitor 116, the inductor 118, and the antenna 114. The diplexer 200 may be placed between the antenna 114 and the tuner circuitry 112 to provide high system performance from the RF front end module 100 to a chipset including the wireless transceiver 120, the modem 130, and the application processor 140. The diplexer 200 also performs frequency domain multiplexing on both high band frequencies and low band frequencies. After the diplexer 200 performs its frequency multiplexing functions on the input signals, the output of the diplexer 200 is fed to an optional LC (inductor/capacitor) network including the capacitor 116 and the inductor 118. The LC network may provide extra impedance matching components for the antenna 114, when desired. Then, a signal with the particular frequency is transmitted or received by the antenna 114. Although a single capacitor and inductor are shown, multiple components are also contemplated.

Figure 2:
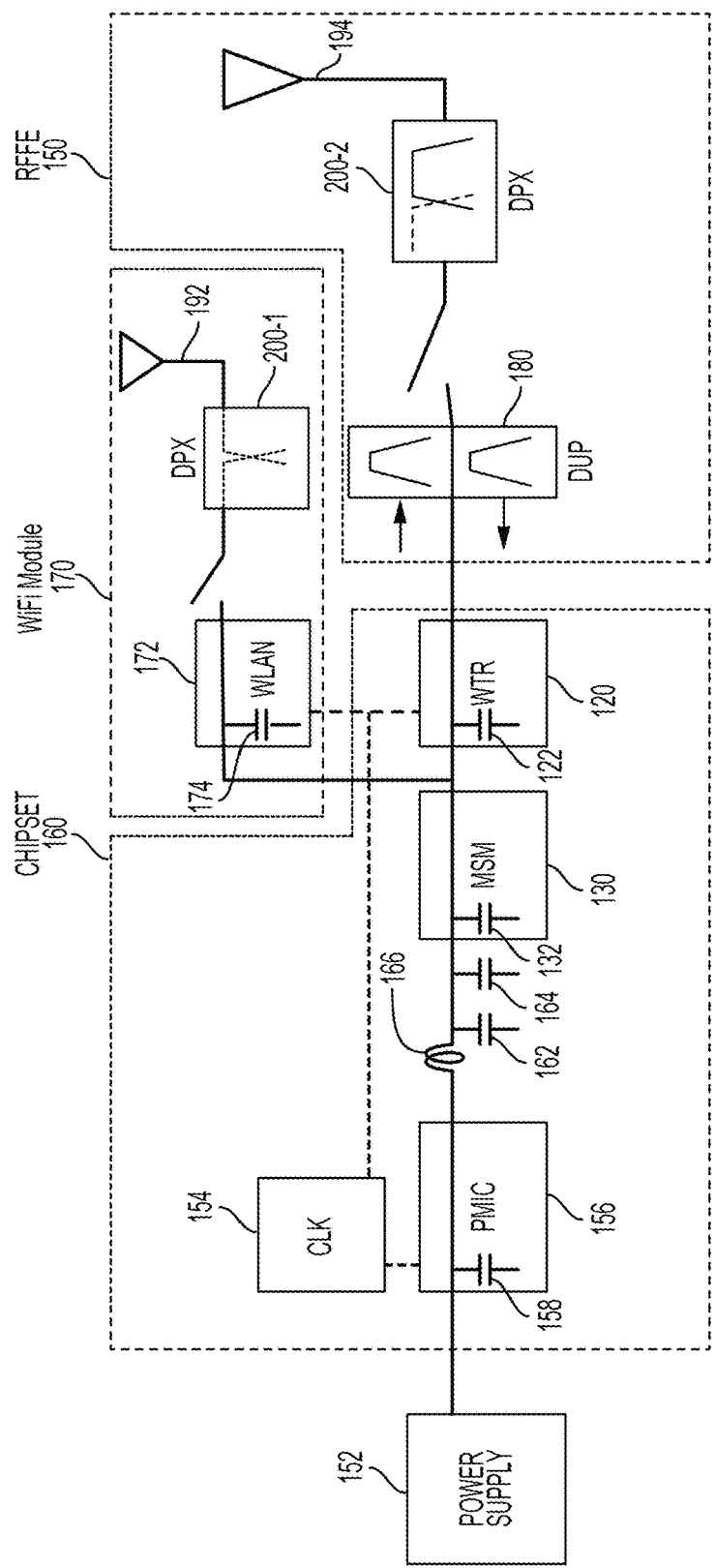
FIG. 2 is a schematic diagram of a radio frequency (RF) front end (RFFE) module employing passive devices for a chipset.

FIG. 2 is a schematic diagram of a wireless local area network (WLAN) (e.g., WiFi) module 170 including a first diplexer 200-1 and an RF front end (RFFE) module 150 including a second diplexer 200-2 for a chipset 160 to provide carrier aggregation. The WiFi module 170 includes the first diplexer 200-1 communicably coupling an antenna 192 to a wireless local area network module (e.g., WLAN module 172). The RF front end module 150 includes the second diplexer 200-2 communicably coupling an antenna 194 to the wireless transceiver (WTR) 120 through a duplexer 180. The wireless transceiver 120 and the WLAN module 172 of the WiFi module 170 are coupled to a modem (MSM, e.g., baseband modem) 130 that is powered by a power supply 152 through a power management integrated circuit (PMIC) 156. The chipset 160 also includes capacitors 162 and 164, as well as an inductor(s) 166 to provide signal integrity.

The PMIC 156, the modem 130, the wireless transceiver 120, and the WLAN module 172 each include capacitors (e.g., 158, 132, 122, and 174) and operate according to a clock 154. The geometry and arrangement of the various capacitor components in the chipset 160 may include placement of a metal or poly shielding material under the capacitors for better signal isolation or lower substrate loss. Unfortunately, this arrangement results in a return current along the shielding material that degrades signal isolation and increases substrate loss due to the poor conductivity of the shielding materials.

Figure 3:
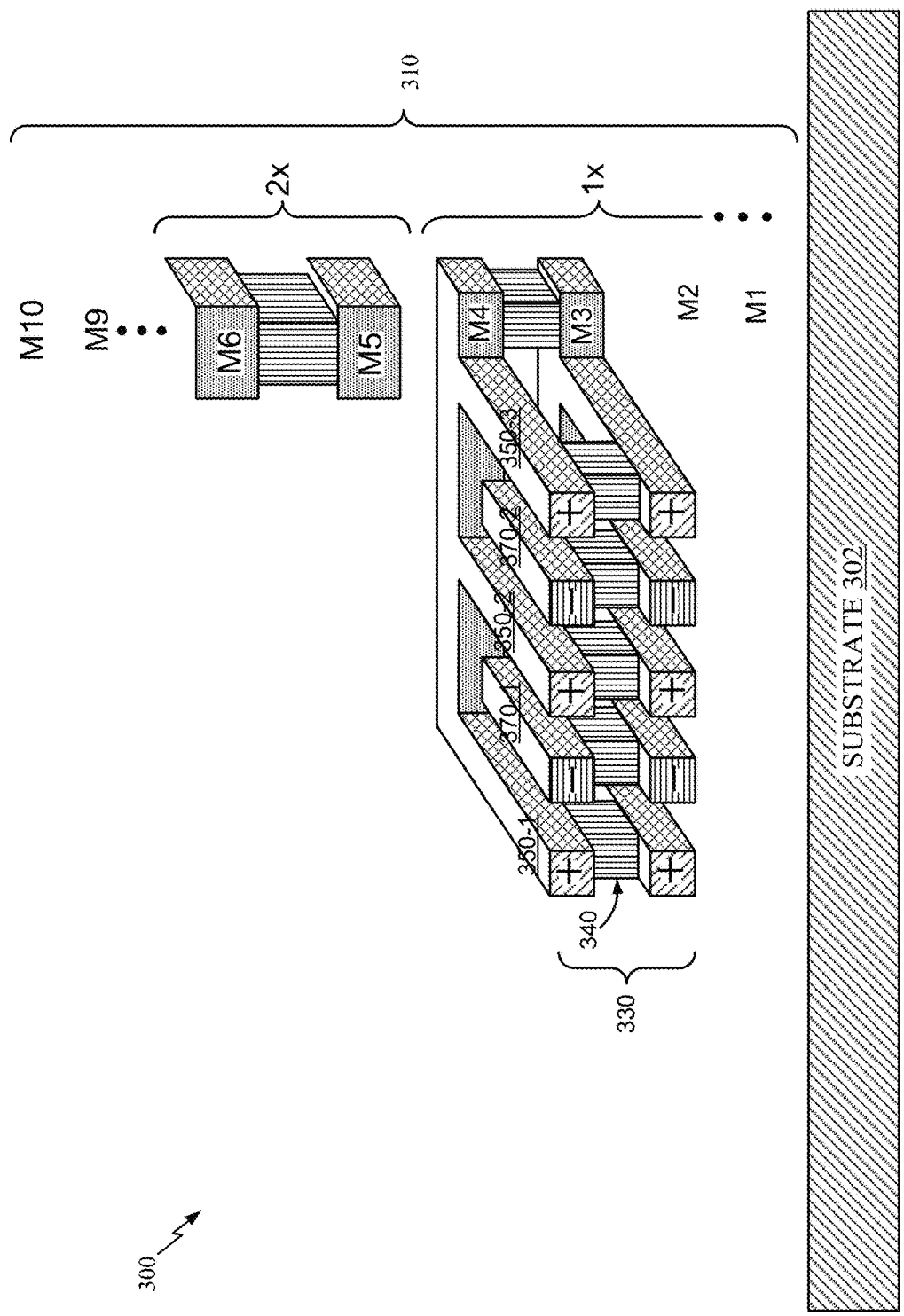
FIG. 3 is a cross section illustrating an integrated circuit (IC) device including an interconnect stack that contains conventional metal-oxide-metal (MOM) capacitor structures.

Capacitors are widely used in analog integrated circuits. FIG. 3 is a block diagram illustrating a cross section of an analog integrated circuit (IC) device 300 including an interconnect stack 310. The interconnect stack 310 of the IC device 300 includes multiple conductive interconnect layers (M1, . . . , M9, M10) on a semiconductor substrate (e.g., a diced silicon wafer) 302. The semiconductor substrate 302 supports a metal-oxide-metal (MOM) capacitor 330. In this example, the MOM capacitor 330 is formed in the M3 and M4 interconnect layers, below the M5 and M6 interconnect layers. The MOM capacitor 330 is formed from lateral conductive fingers of different polarities using the conductive interconnect layers (M3 and M4) of the interconnect stack 310. A dielectric (not shown) is provided between the conductive fingers.

In this example, the MOM capacitor 330 is formed within the lower conductive interconnect layers (e.g., M1-M4) of the interconnect stack 310. The lower conductive interconnect layers of the interconnect stack 310 have smaller interconnect widths and spaces. For example, the dimensions of the conductive interconnect layers M3 and M4 are half the size of the dimensions of the conductive interconnect layers M5 and M6. Likewise, the dimensions of the conductive interconnect layers M1 and M2 are half the size of the dimensions of the conductive interconnect layers M3 and M4. The small interconnect widths and spaces of the lower conductive interconnect layers enable the formation of MOM capacitors with increased capacitance density.

As shown in FIG. 3, the MOM capacitor 330 makes use of a lateral (intra layer) capacitive coupling 340 between fingers (e.g., 350, 370) formed by standard metallization of the conductive interconnects (e.g., wiring lines and vias). The lateral coupling 340 within the MOM capacitor 330 provides improved matching characteristics when compared to the vertical coupling of parallel vertical plate capacitors. The improved matching characteristics of the MOM capacitor 330 are the result of improved process control of the lateral dimensions within the interconnect stack 310. By contrast, the process controls of the vertical dimensions of the conductive interconnect and dielectric layer thickness within the interconnect stack 310 are less precise for fabricating parallel plate capacitors.

Figure 4A:
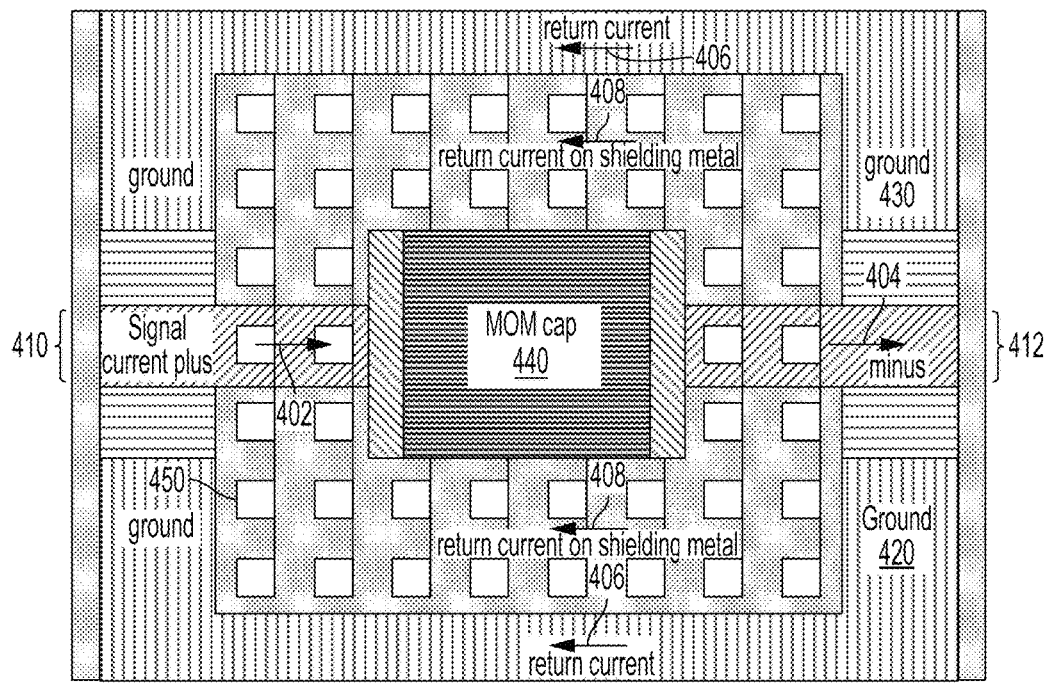
FIG. 4A illustrates a radio frequency (RF) signal path including a coupling capacitor and an RF shielding layer.
Figure 4B:
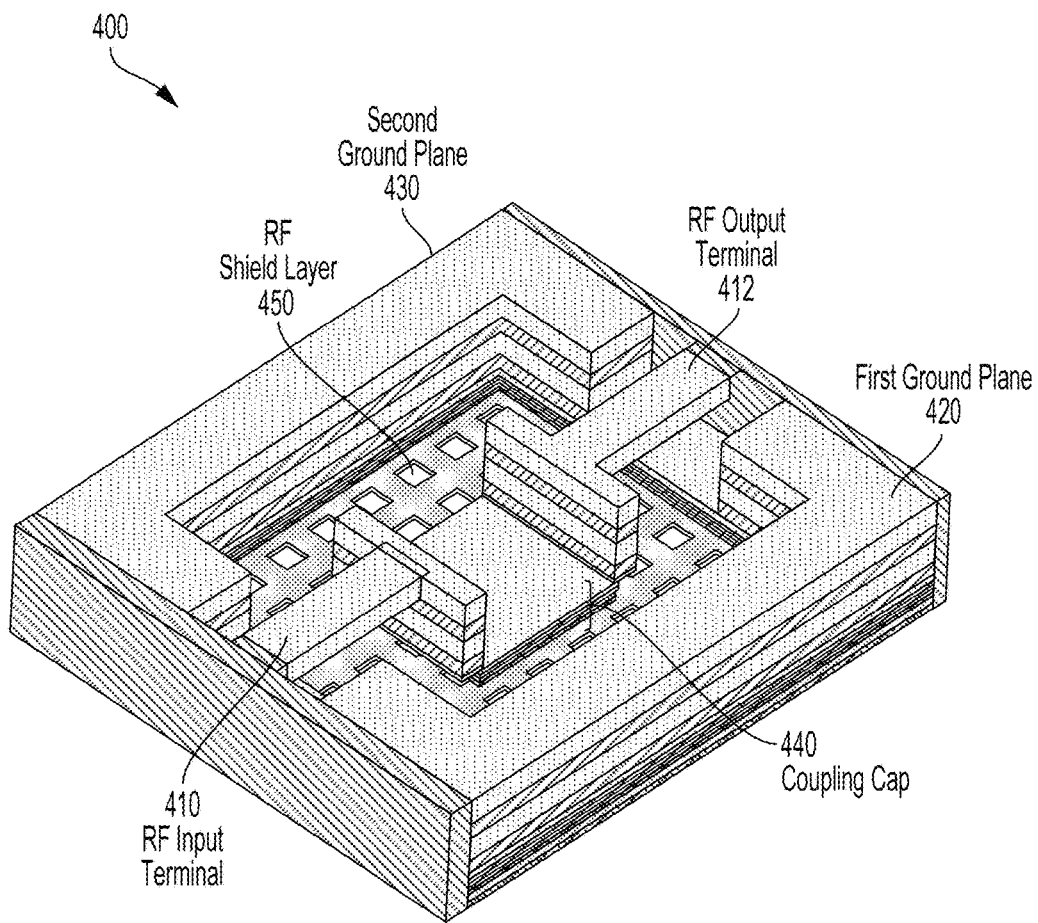
FIG. 4B illustrates a 3D view of the radio frequency (RF) signal path including the coupling capacitor and the RF shielding layer of FIG. 4A.

FIG. 4A illustrates a radio frequency (RF) signal path 400 including a coupling capacitor 440 and an RF shielding layer 450. The RF signal path 400 may use a metal-oxide-metal (MOM) capacitor as the coupling capacitor 440. The coupling capacitor 440 couples an RF input terminal 410 to an RF output terminal 412 of the RF signal path 400 for communicating an RF signal using an upper interconnect layer (e.g., metal 7 (M7)/metal 8 (M8)). FIG. 4B illustrates a 3D view of the radio frequency (RF) signal path 400 including the coupling capacitor 440 and the RF shielding layer 450 of FIG. 4A.

Referring again to FIG. 4A, a current loop is formed with an input signal current 402 flowing between the RF input terminal 410 and through the RF output terminal 412 as an output signal current 404. In addition, due to the current loop, a return current 406 flows over a first ground plane 420 and a second ground plane 430 partially surrounding the coupling capacitor 440. Unfortunately, because the return current 406 tends to flow close to the signal current (402/404), the return current 406 flows on the first ground plane 420 and the second ground plane 430, whereas a degraded return current 408 flows on the RF shielding layer 450, which leads to RF signal loss.

Flow of the degraded return current 408 over the RF shielding layer 450 causes current loss due to poor conductivity of a conductive material of the RF shielding layer 450. In particular, because the RF shielding layer 450 is fabricated at a lower interconnect layer (e.g., metal 1 (M1) or a middle-of-line (MOL) zero layer (M0)), a shielding material may exhibit poor conductivity. This poor conductivity is due to the use of a thin metal layer (for M1) or polysilicon (for M0) to fabricate the RF shielding layer 450. Thus, shielding structures are proposed to limit/prevent the return current flowing on the shielding layer, for example, as shown in FIGS. 5A and 5B.

Figure 5A:
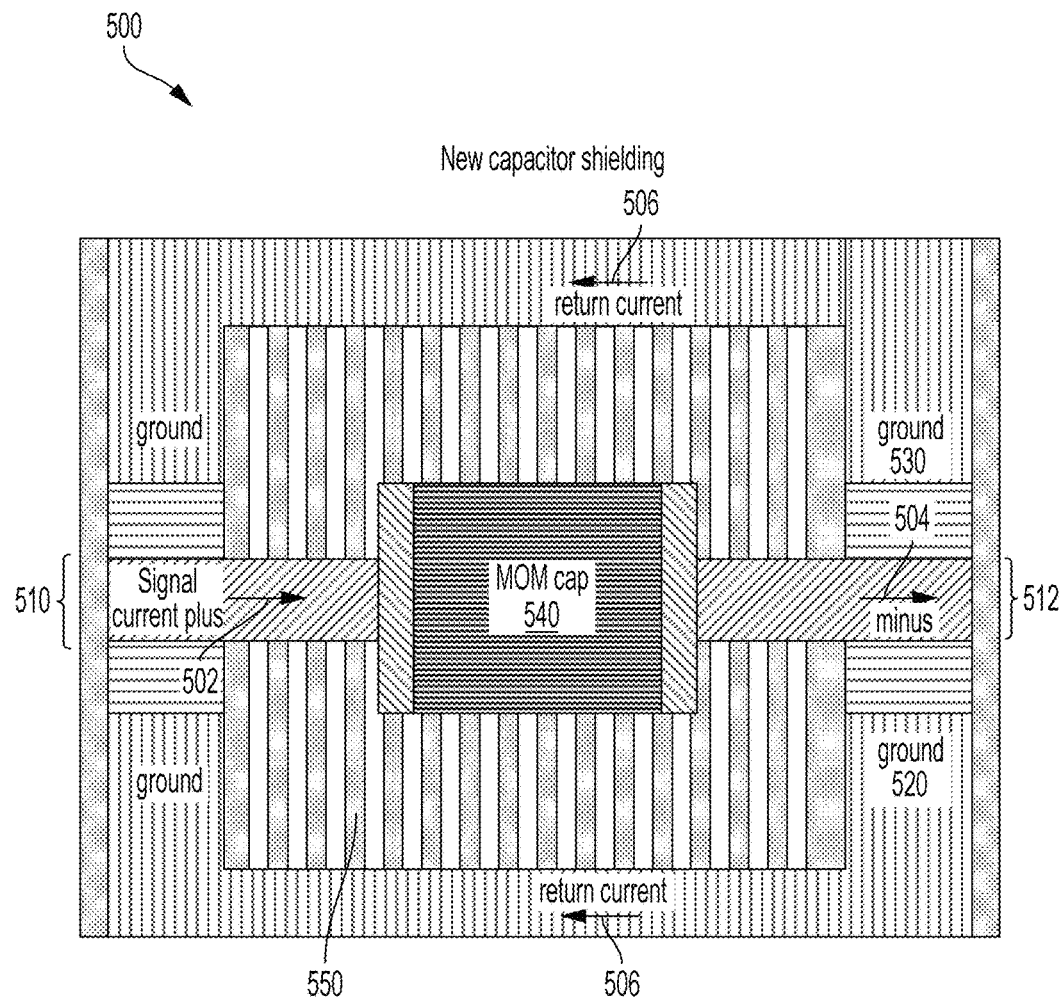
FIG. 5A illustrates a radio frequency (RF) signal path including a coupling capacitor and a patterned RF shielding structure, according to aspects of the present disclosure.
Figure 5B:
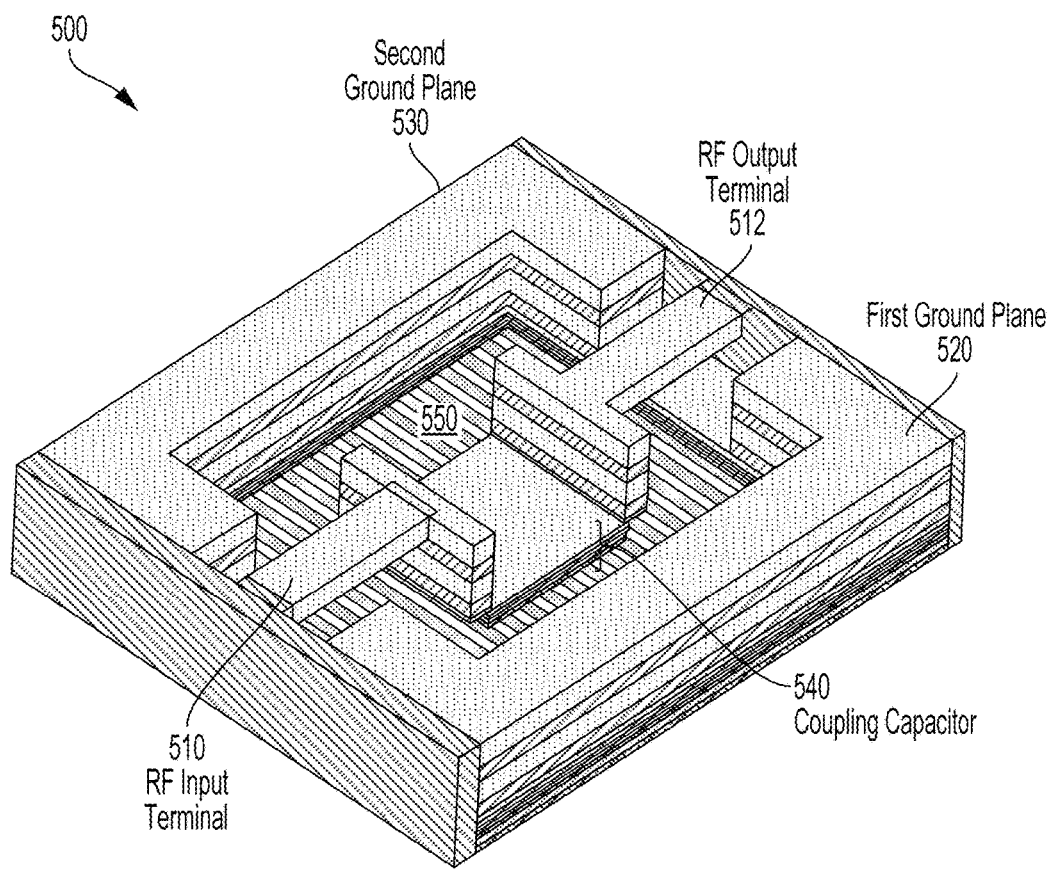
FIG. 5B illustrates a 3D view of the radio frequency (RF) signal path including the coupling capacitor and the patterned RF shielding structure of FIG. 5A, according to aspects of the present disclosure.

FIG. 5A illustrates a radio frequency (RF) signal path 500 including a coupling capacitor 540 and a patterned RF shielding structure 550, according to aspects of the present disclosure. The RF signal path 500 may use a metal-oxide-metal (MOM) capacitor as the coupling capacitor 540. The coupling capacitor 540 couples an RF input terminal 510 to an RF output terminal 512 of the RF signal path 500 for communicating an RF signal using an upper interconnect layer (e.g., metal 7 (M7)/metal 8 (M8)). FIG. 5B illustrates a 3D view of the RF signal path 500 including the coupling capacitor 540 and the patterned RF shielding structure 550 of FIG. 5A.

Referring again to FIG. 5A, a current loop is formed with an input signal current 502 flowing between the RF input terminal 510 and through the RF output terminal 512 as an output signal current 504. In addition, due to the current loop, a return current 506 flows over a first ground plane 520 and a second ground plane 530 partially surrounding the coupling capacitor 540. In this configuration, the patterned RF shielding layer restricts the return current 506 to flowing over the first ground plane 520 and the second ground plane 530 sidewall materials. RF signal loss is reduced because the sidewall materials of the first ground plane 520 and the second ground plane 530 generally exhibit higher conductivity due to fabrication using an upper interconnect layer (e.g., metal 7 (M7)/metal 8 (M8)).

In this aspect of the present disclosure, the patterned RF shielding structure 550 prevents or substantially reduces a degraded return current from flowing over the patterned RF shielding structure 550. According to aspects of the present disclosure, the patterned RF shielding structure 550 is fabricated to electrically disconnect a return current path over the patterned shielding structure. This electrical disconnection confines the return current 506 to flowing over the first ground plane 520 and/or the second ground plane 530. That is, the electrical disconnection prohibits the return current from propagating over the patterned RF shielding structure 550.

Preventing (or reducing) the return current from propagating over the patterned RF shielding structure 550 improves signal isolation and lowers substrate loss because the first ground plane 520 and the second ground plane 530 have better conductivity relative to the conductive material of the patterned RF shielding structure 550. The patterned RF shielding structure 550 may limit and/or prevent the return current flow on shielding materials (e.g., metal or polysilicon) for reducing coupling capacitor loss in the RF signal path 500. As a result, RF signal loss is reduced, such that the input signal current 502 equals the output signal current 504.

FIGS. 6A-6I illustrate various patterned RF shielding structures, according to aspects of the present disclosure.

Figure 6A:
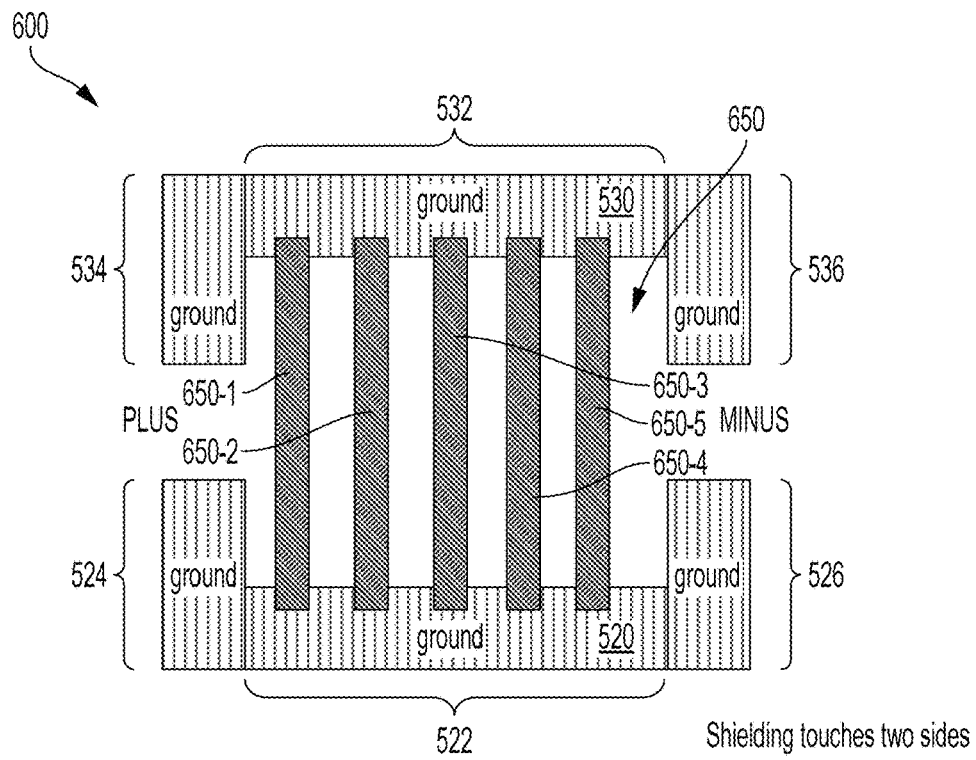
FIGS. 6A-6I illustrate various patterned RF shielding structures, according to aspects of the present disclosure.

FIG. 6A illustrates a configuration 600 of a patterned RF shielding structure 650, according to an aspect of the present disclosure. The configuration 600 of the patterned RF shielding structure 650 is similar to the configuration of the patterned RF shielding structure 550 shown in FIGS. 5A and 5B. The configuration 600 shown in FIG. 6A omits the RF input terminal 510, the RF output terminal 512, and the coupling capacitor 540 to avoid obscuring details of the patterned RF shielding structure 650. These elements are also omitted in the configuration shown in FIGS. 6B-6I.

Referring again to FIG. 6A, the first ground plane 520 is further illustrated as including a sidewall portion 522, a positive terminal portion 524 and a negative terminal portion 526. Similarly, the second ground plane 530 also includes a sidewall portion 532, a positive terminal portion 534, and a negative terminal portion 536. According to aspects of the present disclosure, electrical disconnection of the positive terminal portions (e.g., 524/534) and the negative terminal portions (e.g., 526/536) of the first ground plane 520 or the second ground plane 530 confines a return current 506 to flowing over the first ground plane 520 and/or the second ground plane 530.

In this example, the patterned RF shielding structure 650 includes traces (e.g., 650-1, . . . , 650-5) electrically coupling the sidewall portion 522 of the first ground plane 520 to the sidewall portion 532 of the second ground plane 530. The positive terminal portion 524 and the negative terminal portion 526 of the first ground plane 520, however, are not directly connected by the traces 650 of the patterned RF shielding structure 650. Similarly, the positive terminal portion 534 and the negative terminal portion 536 of the second ground plane 530 are not directly connected by the by the traces 650 of the patterned RF shielding structure 650. This arrangement of the patterned RF shielding structure 650 confines the return current to propagating over the first ground plane 520 and the second ground plane 530.

Figure 6B:
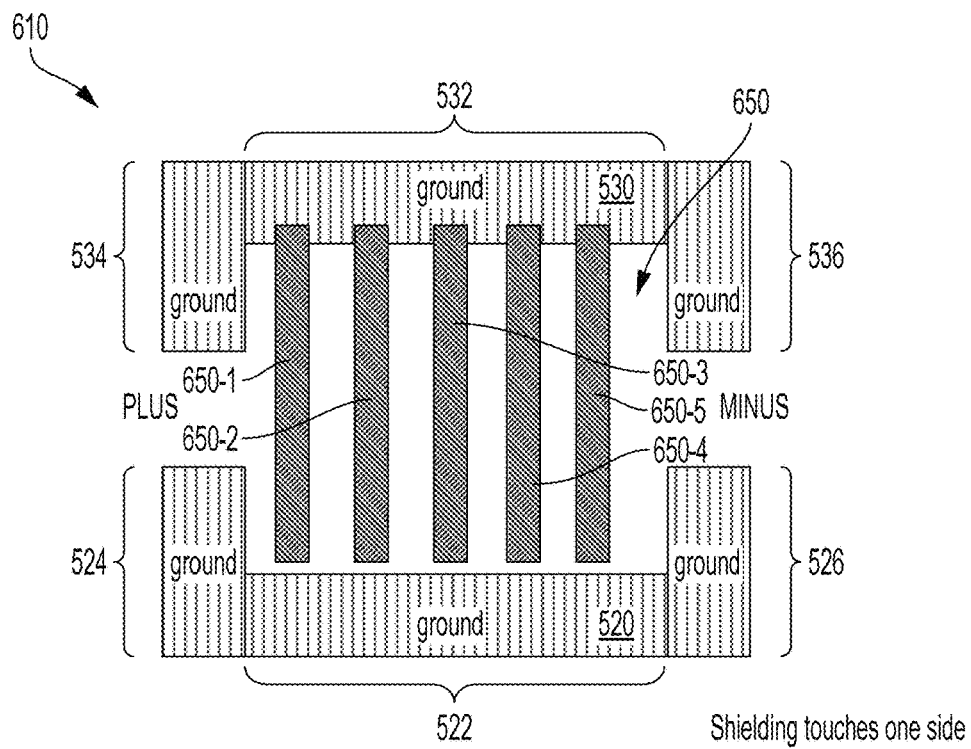

FIG. 6B illustrates a configuration 610 of the patterned RF shielding structure 650, according to another aspect of the present disclosure. The configuration 610 of the patterned RF shielding structure 650 includes the same configuration of the first ground plane 520 and the second ground plane 530 shown in FIG. 6A. In this example, the patterned RF shielding structure 650 also includes traces (e.g., 650-1, . . . ,650-5) electrically coupled to the sidewall portion 532 of the second ground plane 530 but not to the sidewall portion 522 of the first ground plane 520. The positive terminal portion 524 and the negative terminal portion 526 of the first ground plane 520 are not connected by the patterned RF shielding structure 650. Similarly, the positive terminal portion 534 and the negative terminal portion 536 of the second ground plane 530 are not connected by the patterned RF shielding structure 650, which prohibits the return current from propagating over the patterned RF shielding structure 650.

Figure 6C:
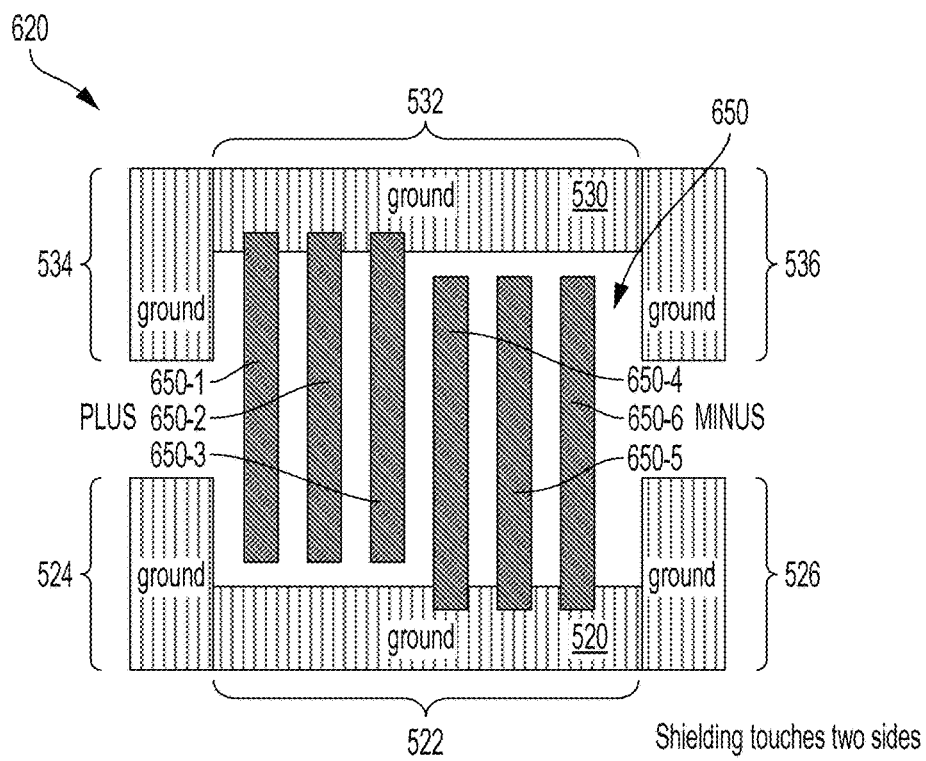

FIG. 6C illustrates a configuration 620 of the patterned RF shielding structure 650, according to another aspect of the present disclosure. This configuration 620 of the patterned RF shielding structure 650 contacts both the first ground plane 520 and the second ground plane 530. In this example, the patterned RF shielding structure 650 includes first traces (e.g., 650-1, 650-2, 650-3) electrically coupled to the sidewall portion 532 of the second ground plane 530 but not to the sidewall portion 522 of the first ground plane 520. In addition, second traces (e.g., 650-4, 650-5, 650-6) are electrically coupled to the sidewall portion 522 of the first ground plane 520 but not to the sidewall portion 532 of the second ground plane 530. The positive terminal portion 524 and the negative terminal portion 526 of the first ground plane 520 are not connected by the patterned RF shielding structure 650. Similarly, the positive terminal portion 534 and the negative terminal portion 536 of the second ground plane 530 are also not connected by the patterned RF shielding structure. As a result, the return current is confined to propagating over the first ground plane 520 and the second ground plane 530.

Figure 6D:
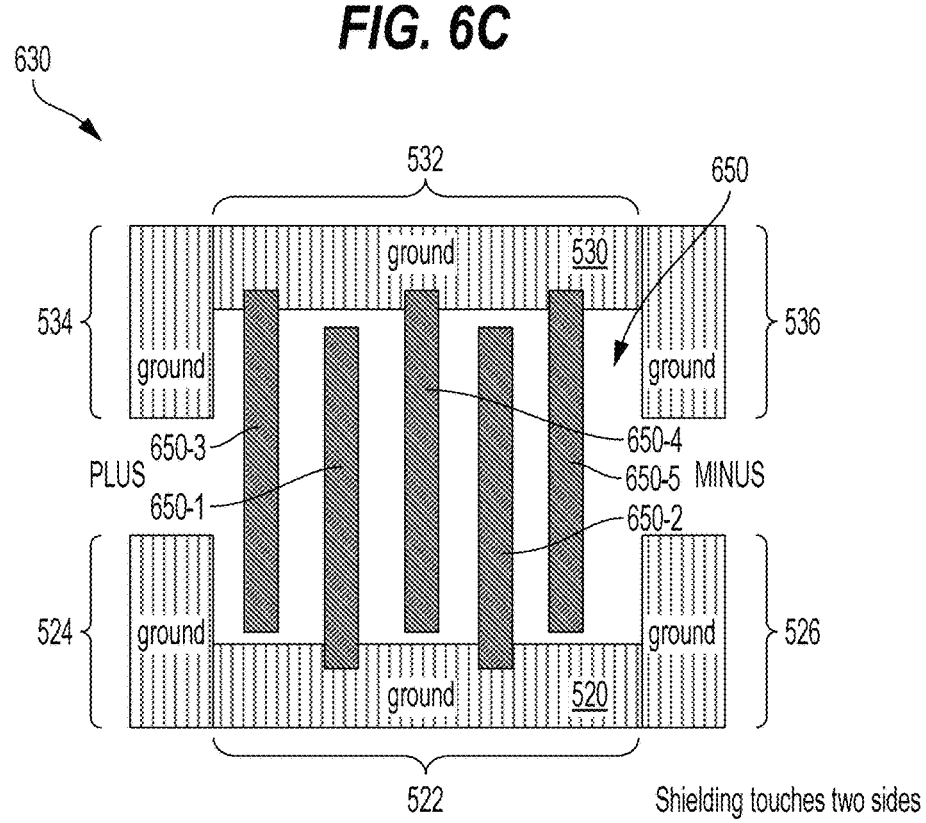

FIG. 6D illustrates a configuration 630 of the patterned RF shielding structure 650, according to another aspect of the present disclosure. This configuration 630 of the patterned RF shielding structure 650 also contacts both the first ground plane 520 and the second ground plane 530. In this example, the patterned RF shielding structure 650 includes first traces (e.g., 650-1, 650-2) electrically coupled to the sidewall portion 522 of the first ground plane 520 but not to the sidewall portion 532 of the second ground plane 530. In addition, second traces (e.g., 650-3, 650-4, 650-5) are electrically coupled to the sidewall portion 532 of the second ground plane 530 but not to the sidewall portion 522 of the first ground plane 520. The positive terminal portion 524 and the negative terminal portion 526 of the first ground plane 520 are not connected by the patterned RF shielding structure 650. Similarly, the positive terminal portion 534 and the negative terminal portion 536 of the second ground plane 530 are also not connected by the patterned RF shielding structure 650. The return current is, therefore, prohibited from propagating over the patterned RF shielding structure 650.

Figure 6E:
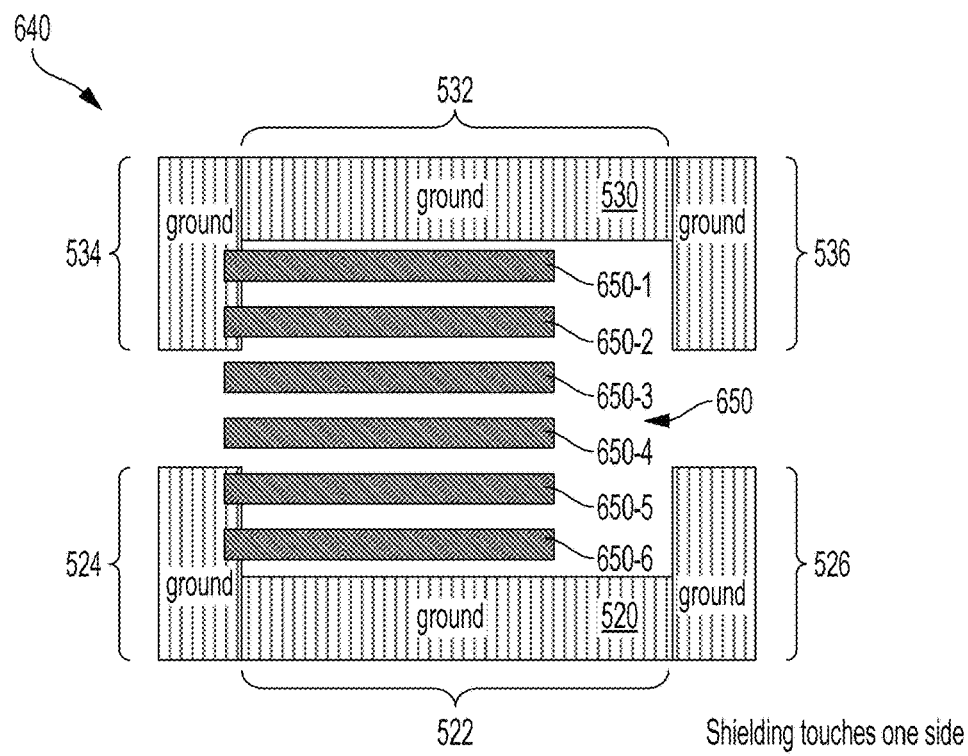

FIG. 6E illustrates a configuration 640 of the patterned RF shielding structure 650, according to another aspect of the present disclosure. In this example, the patterned RF shielding structure 650 includes traces (e.g., 650-1, . . . , 650-6) electrically coupled to the positive terminal portion 524 of the first ground plane 520 and the positive terminal portion 534 of the second ground plane 530. The positive terminal portion 524 and the negative terminal portion 526 of the first ground plane 520, however, are not connected by the traces. Similarly, the positive terminal portion 534 and the negative terminal portion 536 of the second ground plane 530 are also not connected, which prohibits the return current from propagating over the patterned RF shielding structure 650.

Figure 6F:
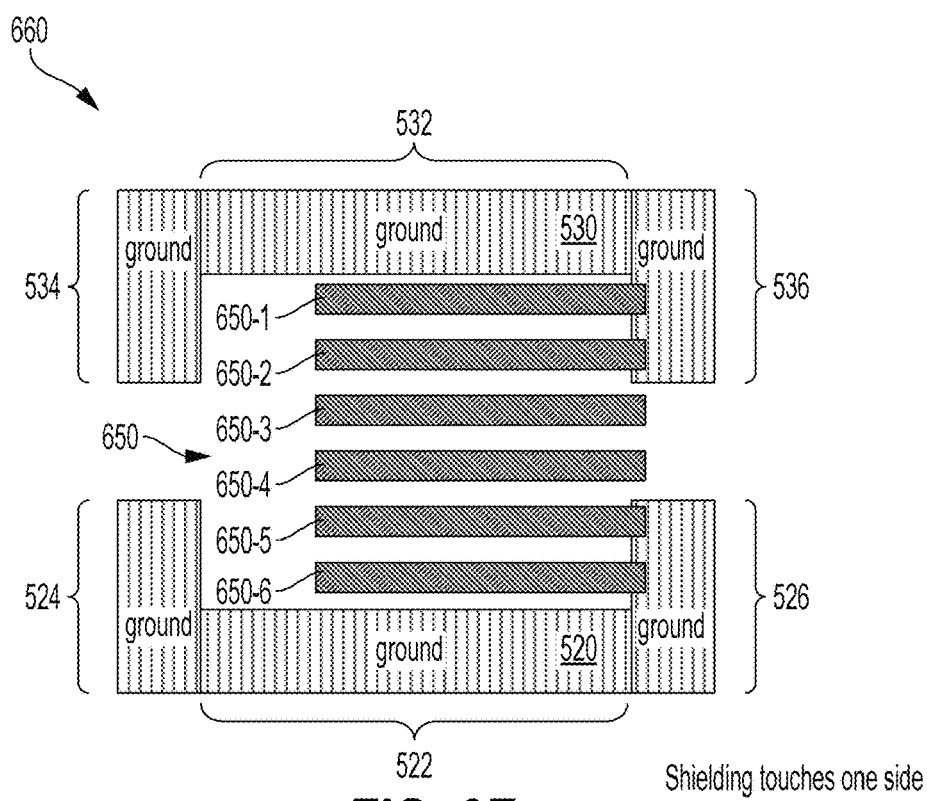

FIG. 6F illustrates a configuration 660 of the patterned RF shielding structure 650, according to another aspect of the present disclosure. In this example, the patterned RF shielding structure 650 includes traces (e.g., 650-1, . . . , 650-6) electrically coupled to the negative terminal portion 526 of the first ground plane 520 and the negative terminal portion 536 of the second ground plane 530. The positive terminal portion 524 and the negative terminal portion 526 of the first ground plane 520, however, are also connected by the traces. Similarly, the positive terminal portion 534 and the negative terminal portion 536 of the second ground plane 530 are also not connected by the traces, which prohibits the return current from propagating over the patterned RF shielding structure 650.

Figure 6G:
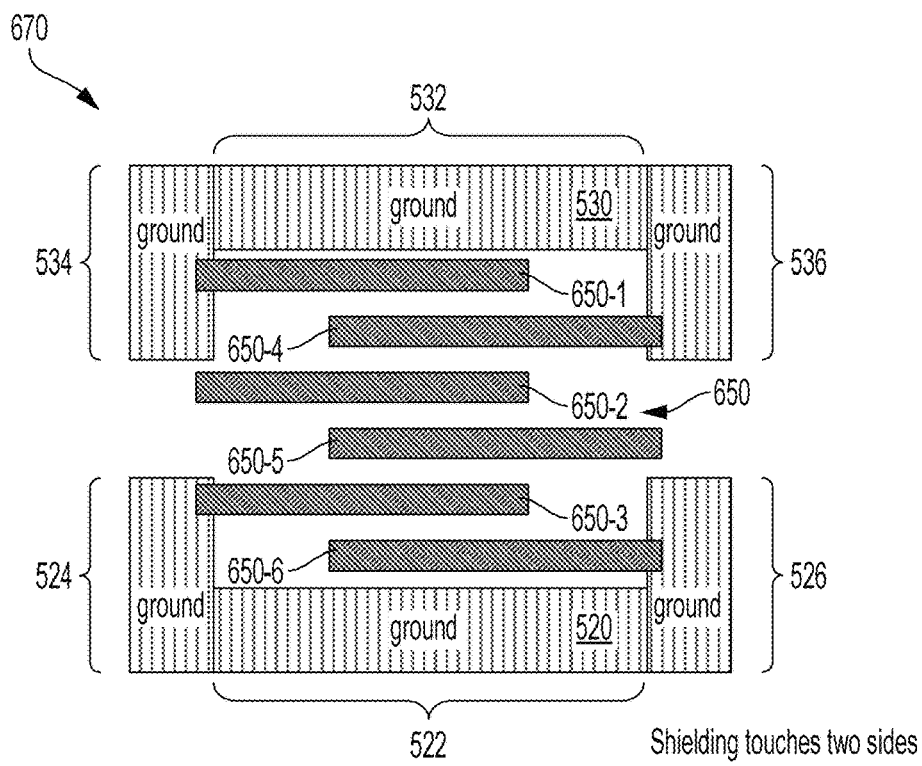

FIG. 6G illustrates a configuration 670 of the patterned RF shielding structure 650, according to another aspect of the present disclosure. This configuration 670 of the patterned RF shielding structure 650 also contacts both the first ground plane 520 and the second ground plane 530. In this example, the patterned RF shielding structure 650 includes first traces (e.g., 650-1, 650-2, 650-3) electrically coupled to the positive terminal portion 524 of the first ground plane 520 and the positive terminal portion 534 of the second ground plane 530. In addition, second traces (e.g., 650-4, 650-5, 650-6) are electrically coupled to the negative terminal portion 526 of the first ground plane 520 and the negative terminal portion 536 of the second ground plane 530. The positive terminal portion 524 and the negative terminal portion 526 of the first ground plane 520 are not connected by the traces, and the positive terminal portion 534 and the negative terminal portion 536 of the second ground plane 530 are also not connected by the traces. These missing connections prohibit the return current from propagating over the patterned RF shielding structure 650.

Figure 6H:
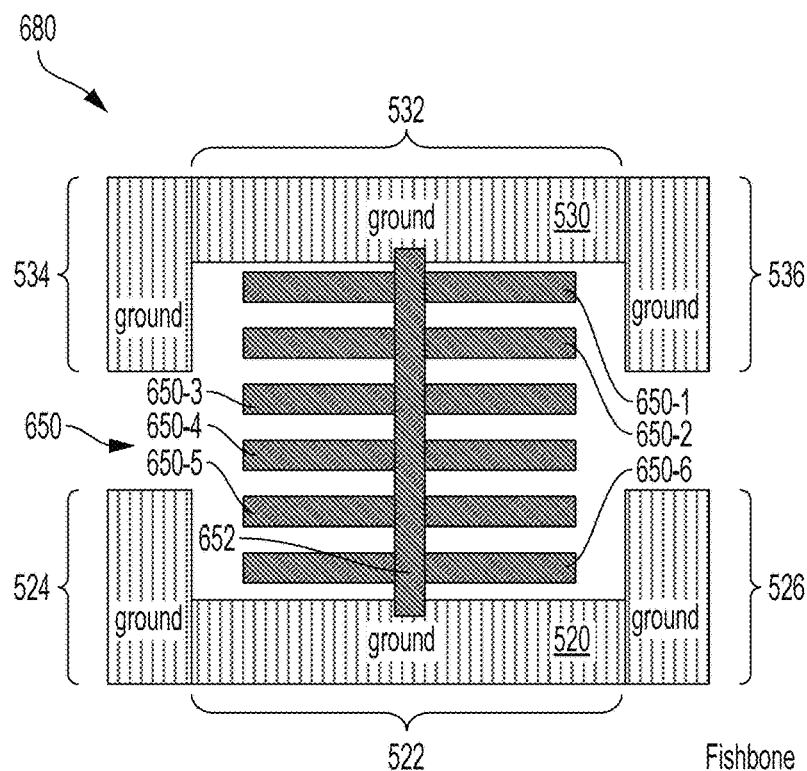

FIG. 6H illustrates a fishbone configuration 680 of the patterned RF shielding structure 650, according to another aspect of the present disclosure. In this example, the patterned RF shielding structure 650 includes first traces (e.g., 650-1, . . . ,650-6) between but electrically disconnected from the positive terminal portion 524 and the negative terminal portion 526 of the first ground plane 520. The first traces (e.g., 650-1, . . . , 650-5) are also electrically disconnected from the positive terminal portion 534 and the negative terminal portion 536 of the second ground plane 530. A second trace 652 electrical contacts the sidewall portion 522 of the first ground plane 520 to the sidewall portion 532 of the second ground plane 530 to form the fishbone configuration 680 of the patterned RF shielding structure 650.

In the fishbone configuration 680, the positive terminal portion 524 and the negative terminal portion 526 of the first ground plane 520 are not connected by the traces of the patterned RF shielding structure 650. Similarly, the positive terminal portion 534 and the negative terminal portion 536 of the second ground plane 530 are also not connected of the traces of the patterned RF shielding structure 650. These missing connections prohibit the return current from propagating over the patterned RF shielding structure 650 according to the fishbone configuration 680.

Figure 6I:
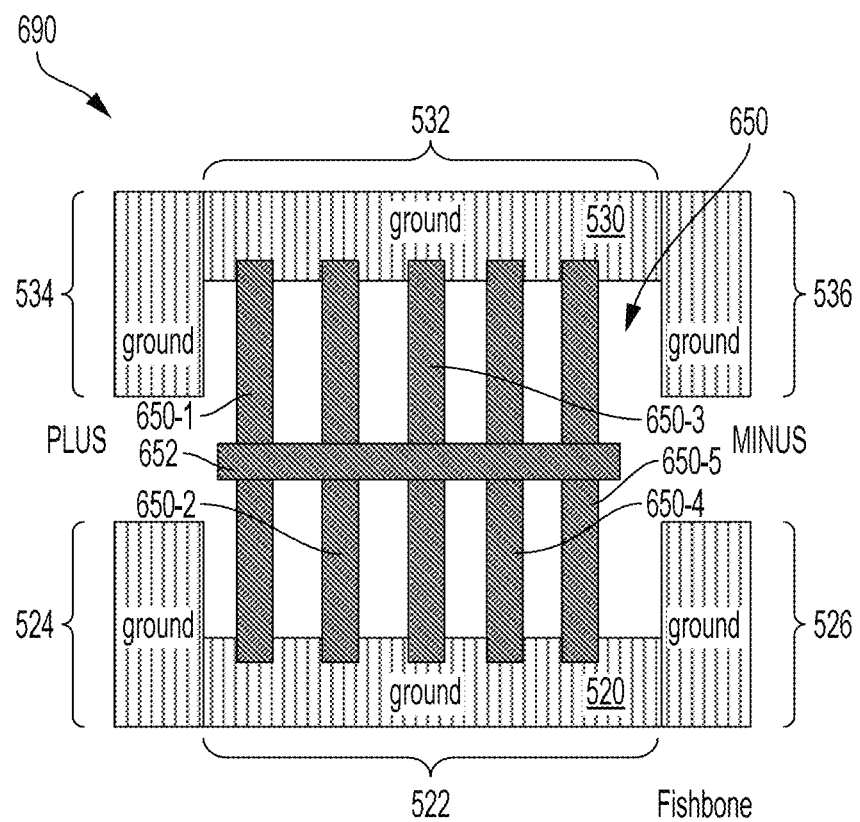

FIG. 6I illustrates a fishbone configuration 690 of the patterned RF shielding structure 650, according to another aspect of the present disclosure. In this example, the patterned RF shielding structure 650 also includes first traces (e.g., 650-1, . . . , 650-6) electrically coupling the sidewall portion 522 of the first ground plane 520 to the sidewall portion 532 of the second ground plane 530. A second trace 652 is between but electrically disconnected from the positive terminal portion 524 and the negative terminal portion 526 of the first ground plane 520 as well as the positive terminal portion 534 and the negative terminal portion 536 of the second ground plane 530.

The second trace 652 completes formation of fishbone configuration 690 of the patterned RF shielding structure 650. In the fishbone configuration 690, the positive terminal portion 524 and the negative terminal portion 526 of the first ground plane 520 are also not connected by the traces of the patterned RF shielding structure 650. Similarly, the positive terminal portion 534 and the negative terminal portion 536 of the second ground plane 530 are also not connected by the traces of the patterned RF shielding structure 650. The return current is, therefore, propagating over the patterned RF shielding structure 650 according to the fishbone configuration 690.

Figure 7:
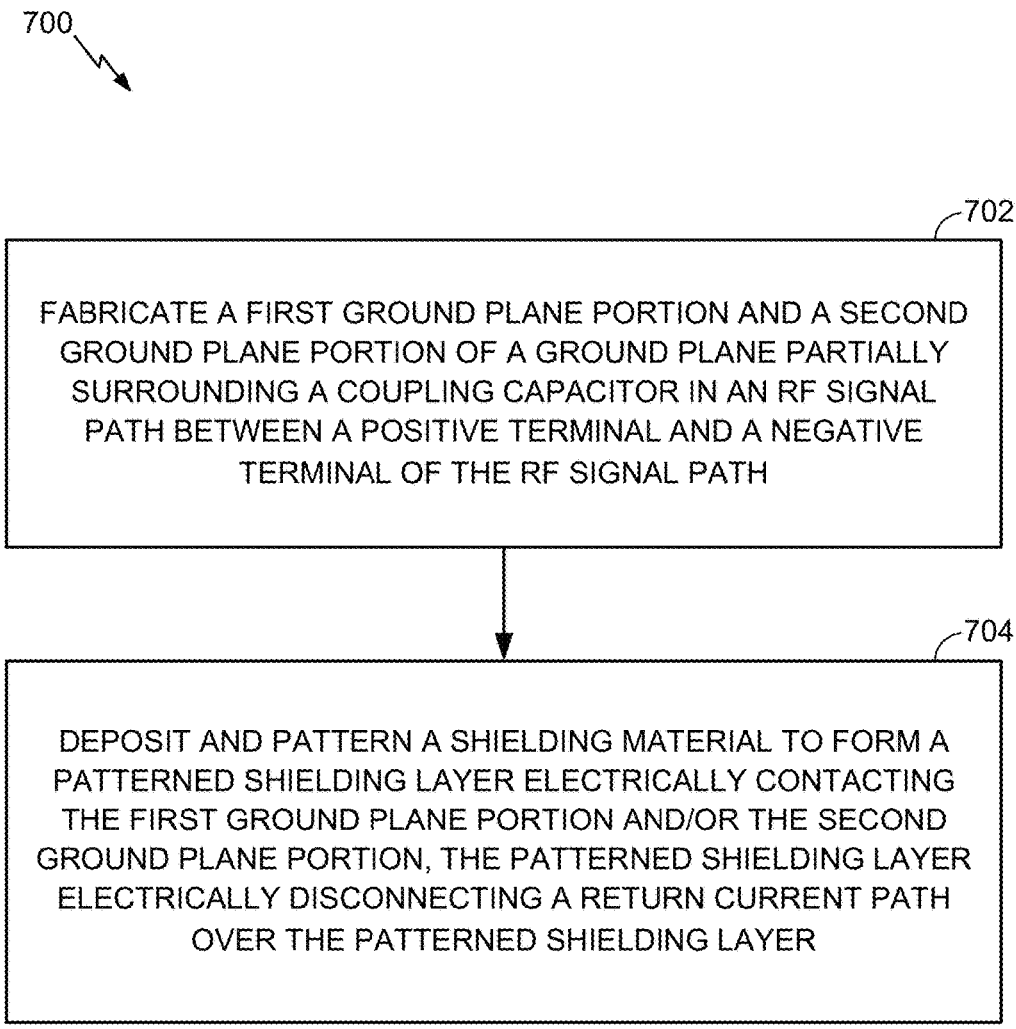
FIG. 7 is a process flow diagram illustrating a method for fabricating a coupling capacitor radio frequency (RF) shielding structure, according to an aspect of the present disclosure.

The patterned RF shielding structure for limiting and/or preventing return current flow on shielding materials is further described with respect to FIG. 7.

FIG. 7 is a process flow diagram illustrating a method 700 for fabricating a capacitor RF shielding structure, according to an aspect of the present disclosure. In block 702, a first ground plane portion and a second ground plane portion of a ground plane are fabricated to partially surround a coupling capacitor in an RF signal path between a positive terminal and a negative terminal of the RF signal path. For example, as shown in FIG. 5B, the second ground plane 530 is opposite the first ground plane 520.

In block 704, a shielding material is deposited and patterned to form a patterned shielding layer electrically contacting the first ground plane portion and/or the second ground plane portion. As shown in FIGS. 6A-6I, the patterned RF shielding structure 650 electrically disconnects a return current path over the patterned RF shielding structure 650. Depositing and patterning the shielding material may include depositing and patterning a polysilicon material on a substrate. Disconnection of the return current path in the patterned RF shielding structure 650 may confine a return current to flowing over the first ground plane 520 and/or the second ground plane 530. It should be recognized that the return current may be not completely confined to the first ground plane 520 or the second ground plane 530.

According to a further aspect of the present disclosure, an RF capacitor structure is described. In one configuration, the RF capacitor shielding structure includes means for electrically disconnecting a return current path and redirecting a return current to flowing over a first ground plane portion or a second ground plane portion of a ground plane. In one configuration, the disconnecting means may be the patterned RF shielding structure 650, as shown in FIGS. 6A-6I. In another aspect, the aforementioned means may be any structure or any material configured to perform the functions recited by the aforementioned means.

Figure 8:
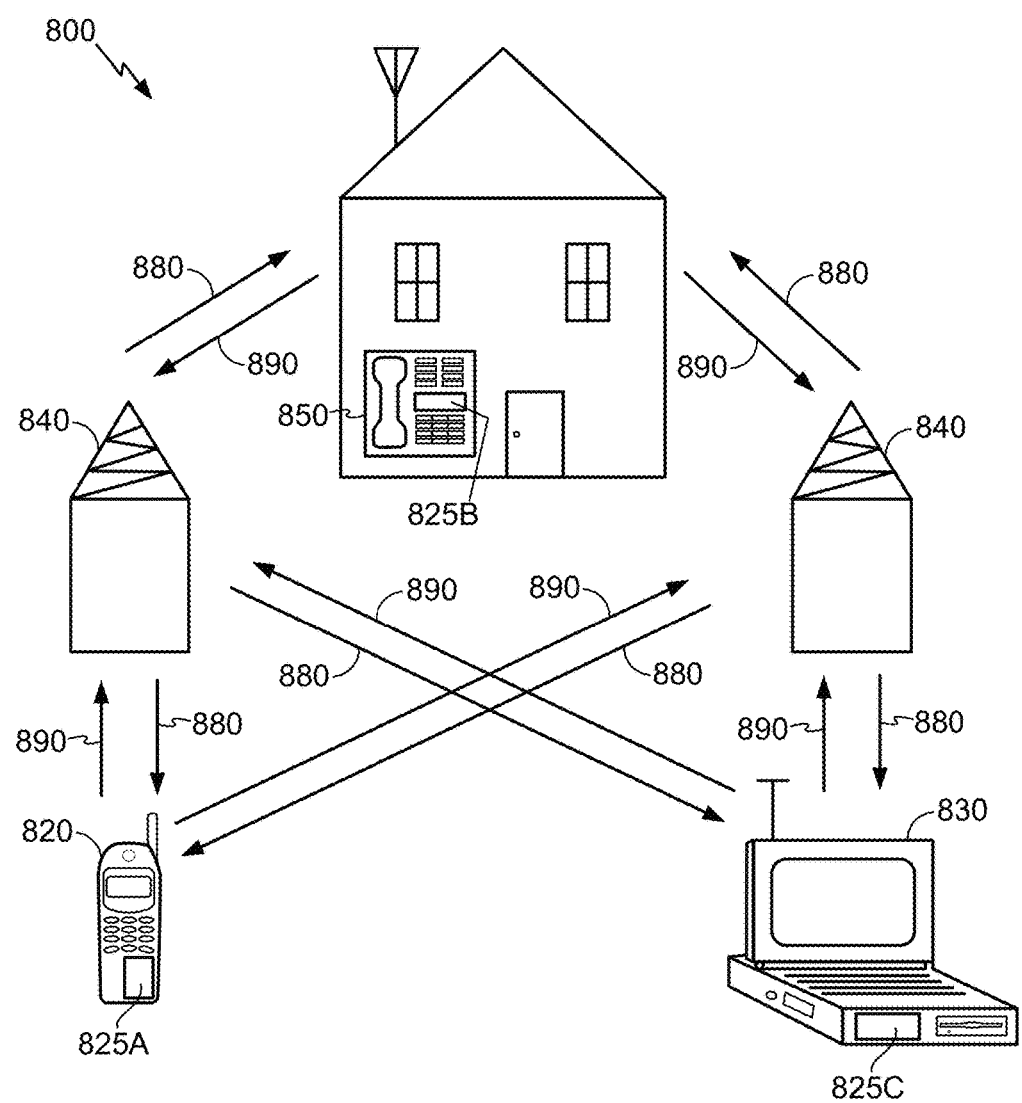
FIG. 8 is a block diagram showing an exemplary wireless communication system in which a configuration of the disclosure may be advantageously employed.

FIG. 8 is a block diagram showing an exemplary wireless communication system 800 in which an aspect of the disclosure may be advantageously employed. For purposes of illustration, FIG. 8 shows three remote units 820, 830, and 850 and two base stations 840. It will be recognized that wireless communication systems may have many more remote units and base stations. Remote units 820, 830, and 850 include IC devices 825A, 825C, and 825B that include the disclosed patterned RF shielding structure. It will be recognized that other devices may also include the disclosed patterned RF shielding structure, such as the base stations, switching devices, and network equipment. FIG. 8 shows forward link signals 880 from the base station 840 to the remote units 820, 830, and 850 and reverse link signals 890 from the remote units 820, 830, and 850 to base stations 840.

In FIG. 8, remote unit 820 is shown as a mobile telephone, remote unit 830 is shown as a portable computer, and remote unit 850 is shown as a fixed location remote unit in a wireless local loop system. For example, the remote units may be a mobile phone, a hand-held personal communication systems (PCS) unit, a portable data unit, such as a personal data assistant, a GPS enabled device, a navigation device, a set top box, a music player, a video player, an entertainment unit, a fixed location data unit, such as a meter reading equipment, or other device that stores or retrieves data or computer instructions, or combinations thereof. Although FIG. 8 illustrates remote units according to the aspects of the disclosure, the disclosure is not limited to these exemplary illustrated units. Aspects of the disclosure may be suitably employed in many devices, which include the disclosed patterned RF shielding structure.

Figure 9:
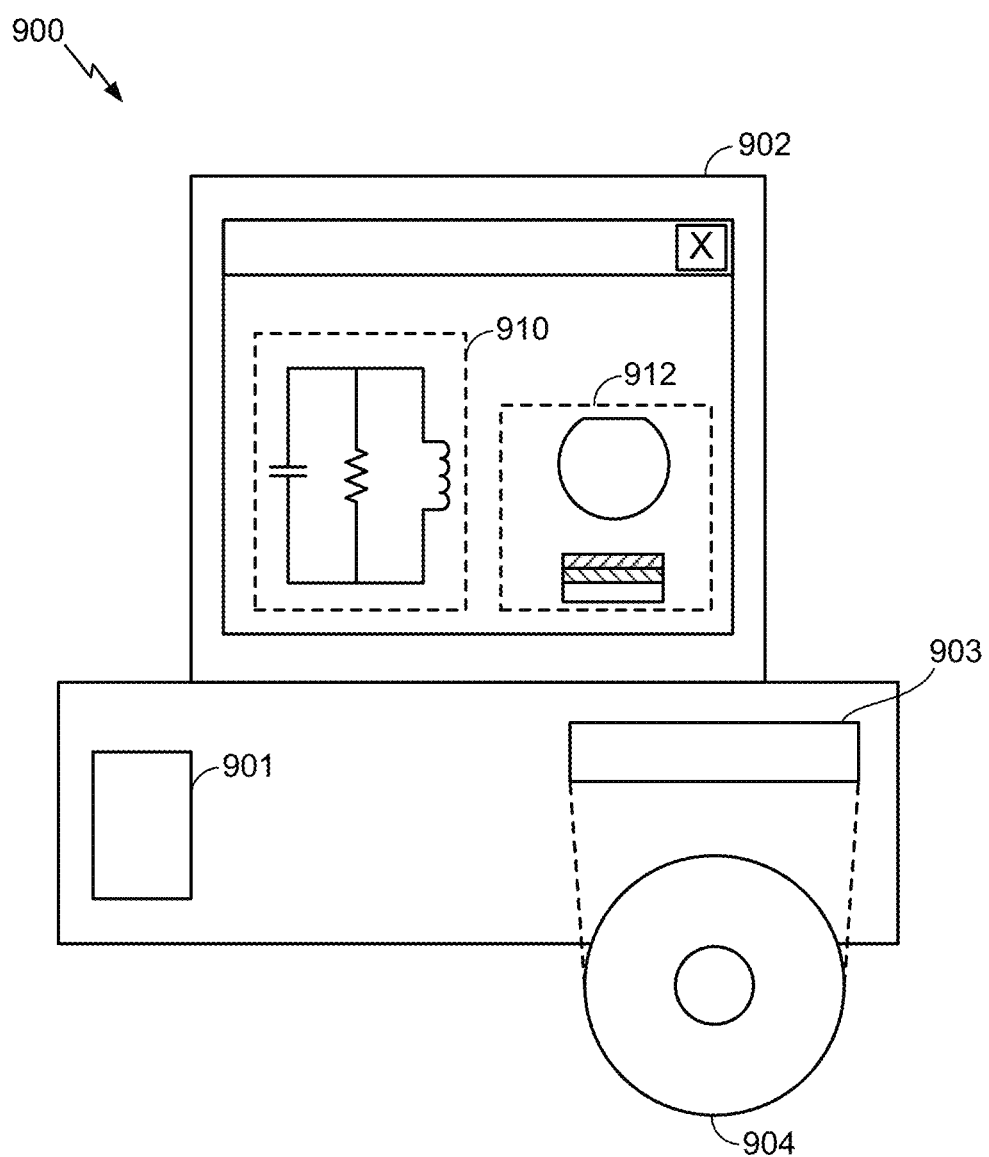
FIG. 9 is a block diagram illustrating a design workstation used for circuit, layout, and logic design of a semiconductor component according to one configuration.

FIG. 9 is a block diagram illustrating a design workstation used for circuit, layout, and logic design of a semiconductor component, such as the patterned RF shielding structure disclosed above. A design workstation 900 includes a hard disk 901 containing operating system software, support files, and design software such as Cadence or OrCAD. The design workstation 900 also includes a display 902 to facilitate design of a circuit 910 or a patterned RF shielding structure 912. A storage medium 904 is provided for tangibly storing the design of the circuit 910 or the patterned RF shielding structure 912. The design of the circuit 910 or the patterned RF shielding structure 912 may be stored on the storage medium 904 in a file format such as GDSII or GERBER. The storage medium 904 may be a CD-ROM, DVD, hard disk, flash memory, or other appropriate device. Furthermore, the design workstation 900 includes a drive apparatus 903 for accepting input from or writing output to the storage medium 904.

Data recorded on the storage medium 904 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 904 facilitates the design of the circuit 910 or the patterned RF shielding structure 912 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of ordinary skill in the art would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A capacitor radio frequency (RF) shielding structure, comprising:
   a ground plane partially surrounding a coupling capacitor in an RF signal path, the ground plane comprising:
      a first ground plane portion extending between a positive terminal of the RF signal path and a negative terminal of the RF signal path, and
      a second ground plane portion extending between the positive terminal and the negative terminal of the RF signal path, the second ground plane portion opposing the first ground plane portion; and
   a patterned shielding layer electrically contacting the first ground plane portion and/or the second ground plane portion, the patterned shielding layer electrically disconnecting a return current path over the patterned shielding layer to confine a return current to flowing over the first ground plane portion or the second ground plane portion.

2. The capacitor RF shielding structure of claim 1, in which the patterned shielding layer comprises traces connecting an intermediate side of the first ground plane portion to an intermediate side of the second ground plane portion, the traces being orthogonal to the RF signal path.

3. The capacitor RF shielding structure of claim 1, in which the patterned shielding layer comprises traces connected to an intermediate side of the first ground plane portion and disconnected from an intermediate side of the second ground plane portion.

4. The capacitor RF shielding structure of claim 1, in which the patterned shielding layer comprises traces connecting to the first ground plane portion and the second ground plane portion proximate the positive terminal of the RF signal path and disconnected from the first ground plane portion and the second ground plane portion proximate the negative terminal of the RF signal path.

5. The capacitor RF shielding structure of claim 1, in which the patterned shielding layer comprises traces of metal or polysilicon.

6. The capacitor RF shielding structure of claim 1, in which the patterned shielding layer is formed in a first interconnect layer (M1).

7. The capacitor RF shielding structure of claim 1, in which the patterned shielding layer is formed in a zero interconnect layer (M0).

8. The capacitor RF shielding structure of claim 1, in which the coupling capacitor comprises a metal-oxide-metal (MOM) capacitor.

9. The capacitor RF shielding structure of claim 1, integrated into a mobile phone, a set top box, a music player, a video player, an entertainment unit, a navigation device, a computer, a hand-held personal communication systems (PCS) unit, a portable data unit, and/or a fixed location data unit.

10. A method for fabricating a capacitor radio frequency (RF) shielding structure, comprising:
    fabricating a first ground plane portion and a second ground plane portion of a ground plane partially surrounding a coupling capacitor in an RF signal path between a positive terminal and a negative terminal of the RF signal path, the second ground plane portion opposing the first ground plane portion; and
    depositing and patterning a shielding material to form a patterned shielding layer electrically contacting the first ground plane portion and/or the second ground plane portion, the patterned shielding layer electrically disconnecting a return current path over the patterned shielding layer to confine a return current to flowing over the first ground plane portion or the second ground plane portion.

11. The method of claim 10, in which depositing and patterning further comprises depositing traces electrically connecting an intermediate side of the first ground plane portion to an intermediate side of the second ground plane portion, the traces being orthogonal to the RF signal path.

12. The method of claim 10, in which depositing and patterning further comprises depositing traces connected to an intermediate side of the first ground plane portion and disconnected from an intermediate side of the second ground plane portion.

13. The method of claim 10, in which depositing and patterning the shielding material comprises depositing and patterning a polysilicon material on a substrate.

14. The method of claim 10, in which the capacitor RF shielding structure is integrated into a mobile phone, a set top box, a music player, a video player, an entertainment unit, a navigation device, a computer, a hand-held personal communication systems (PCS) unit, a portable data unit, and/or a fixed location data unit.

15. A capacitor radio frequency (RF) shielding structure, comprising:
- a ground plane partially surrounding a coupling capacitor in an RF signal path, the ground plane comprising:
    - a first ground plane portion extending between a positive terminal of the RF signal path and a negative terminal of the RF signal path, and
    - a second ground plane portion extending between the positive terminal and the negative terminal of the RF signal path, the second ground plane portion opposing the first ground plane portion; and
- means for electrically disconnecting a return current path and redirecting a return current to flowing over the first ground plane portion and/or the second ground plane portion.

16. The capacitor RF shielding structure of claim 15, in which the coupling capacitor comprises a metal-oxide-metal (MOM) capacitor.

17. The capacitor RF shielding structure of claim 15, in which the ground plane comprises an intermediate side of the first ground plane portion, disconnected from an intermediate side of the second ground plane portion.

18. The capacitor RF shielding structure of claim 15, in which the coupling capacitor is formed in a first interconnect layer (M1).

19. The capacitor RF shielding structure of claim 15, in which the ground plane is formed in an upper interconnect layer.

20. The capacitor RF shielding structure of claim 15, integrated into a mobile phone, a set top box, a music player, a video player, an entertainment unit, a navigation device, a computer, a hand-held personal communication systems (PCS) unit, a portable data unit, and/or a fixed location data unit.

* * * * *